US012593611B2

(12) United States Patent
Suzuki

(10) Patent No.: US 12,593,611 B2
(45) Date of Patent: Mar. 31, 2026

(54) RESERVOIR ELEMENT AND NEUROMORPHIC DEVICE

(71) Applicant: TDK CORPORATION, Tokyo (JP)

(72) Inventor: Eiji Suzuki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 922 days.

(21) Appl. No.: 17/794,839

(22) PCT Filed: Mar. 25, 2020

(86) PCT No.: PCT/JP2020/013194
§ 371 (c)(1),
(2) Date: Jul. 22, 2022

(87) PCT Pub. No.: WO2021/192069
PCT Pub. Date: Sep. 30, 2021

(65) Prior Publication Data
US 2023/0055056 A1 Feb. 23, 2023

(51) Int. Cl.
*H01L 41/04* (2006.01)
*H10N 30/20* (2023.01)
*H10N 30/80* (2023.01)
*H10N 30/87* (2023.01)
*H10N 35/00* (2023.01)

(52) U.S. Cl.
CPC ........... *H10N 30/20* (2023.02); *H10N 30/802* (2023.02); *H10N 30/87* (2023.02); *H10N 35/00* (2023.02)

(58) Field of Classification Search
CPC ....... H10N 30/20; H10N 30/802; H10N 30/87
See application file for complete search history.

(56) References Cited

U.S. PATENT DOCUMENTS

2014/0202260 A1 7/2014 Nakamura

FOREIGN PATENT DOCUMENTS

| | | | |
|---|---|---|---|
| JP | 2002-189067 A | 7/2002 | |
| JP | 2003-282992 A | 10/2003 | |
| WO | 2013/132746 A1 | 9/2013 | |
| WO | WO 2020/105136 * | 5/2020 | ............. H01L 29/82 |

OTHER PUBLICATIONS

Nakane et al.; "Reservoir Computing With Spin Waves Excited in a Garnet Film;" IEEE Access; 2018; pp. 4462-4469; vol. 6.
Coulombe et al.; "Computing with networks of nonlinear mechanical oscillators;" PLOS One; 2017; pp. 1-13; vol. 12, No. 6.
Katakami et al.; "A Study on Coupled Nonlinear MEMS Resonators for Reservoir Computing;" IEICE Technical Report, CAS2019-33, NLP2019-73(Oct. 2019); 2019; pp. 49-54; vol. 119, No. 237; The Institute of Electronics, Information and Communication Engineers.

(Continued)

*Primary Examiner* — Derek J Rosenau
(74) *Attorney, Agent, or Firm* — Oliff PLC

(57) ABSTRACT

A reservoir element according to an embodiment has a plurality of vibrators, at least one of the plurality of vibrators has a vibration state different from vibration states of the other vibrators, and vibrations of the plurality of vibrators are configured to affect each other.

18 Claims, 7 Drawing Sheets

(56) References Cited

OTHER PUBLICATIONS

Dion et al.; "Reservoir computing with a single delay-coupled non-linear mechanical oscillator;" J. Appl. Phys .; 2018; pp. 152132-1-152132-9; vol. 124, No. 152132.
Tang et al.; "Using nonlinear jumps to estimate cubic stiffness nonlinearity: An experimental study;" Proc IMechE Part C: J Mechanical Engineering Science; 2015; pp. 1-7.
He et al.; "A State-Space Phase-Noise Model for Nonlinear MEMS Oscillators Employing Automatic Amplitude Control;" IEEE Transactions on Circuits and Systems-I: Regular Papers; 2010; pp. 189-199; vol. 52, No. 1.
Jul. 14, 2020 Search Report issued in International Patent Application No. PCT/JP2020/013194.

* cited by examiner

RESERVOIR ELEMENT AND NEUROMORPHIC DEVICE

TECHNICAL FIELD

The present invention relates to a reservoir element and a neuromorphic device.

BACKGROUND ART

Neuromorphic devices are elements which mimic the human brain by means of neural networks. Neuromorphic devices artificially mimic the relationship between neurons and synapses in the human brain.

Neuromorphic devices have, for example, chips which are hierarchically disposed (neurons in the brain) and a transmission means (synapses in the brain) for connecting them. Neuromorphic devices increase the percentage of correct answers to questions when transmission means (synapses) learn. Learning is to find knowledge which will be used in the future from information and neuromorphic devices weight the input data.

As one of neural networks, recurrent neural networks are known. Recurrent neural networks can handle non-linear time-series data. Non-linear time-series data is data whose value changes with the passage of time and stock prices and the like are an example. Recurrent neural networks can process time-series data by returning the processing results of the neurons in a subsequent layer to the neurons of a previous layer.

Reservoir computing is one of the means for realizing recurrent neural networks. Reservoir computing performs recursive processing by signals interacting. Reservoir computing, for example, mimics the behavior of the cerebellum and performs recursive data processing, data conversion (for example, coordinate conversion), and the like. Non-Patent Literature 1 describes a reservoir element which uses spin waves.

CITATION LIST

Patent Literature

[Non-Patent Literature 1] Ryosho Nakane, Gouhei Tanaka, and Akira Hirose, IEEE Access Vol. 6 2018 pp. 4462 to 4469.

SUMMARY OF INVENTION

Technical Problem

The reservoir element of Non-Patent Literature 1 uses spin waves. The reservoir element using spin waves has many problems for industrialization. In addition, the accuracy of an output of a reservoir for training data varies in accordance with the parameter setting of the reservoir. Providing a certain distribution to parameters of the reservoir increases the accuracy of the output of the reservoir for the training data. There is a demand for an element structure in which the distribution of the parameters of the reservoir can be reflected in an actual element.

The present invention was made in view of the above circumstances and provides a reservoir element and a neuromorphic device having high accuracy of an output signal.

Solution to Problem (1) A reservoir element according to a first aspect includes: a plurality of vibrators, in which at least one of the plurality of vibrators has a vibration state different from vibration states of the other vibrators, and vibrations of the plurality of vibrators are configured to affect each other.

(2) The reservoir element according to the aspect may further include: a connection plate. The connection plate may be connected to each of the plurality of vibrators.

(3) In the reservoir element according to the aspect, at least one of the plurality of vibrators has a size or a material different from sizes or materials of the other vibrators.

(4) In the reservoir element according to the aspect, each of the plurality of vibrators may have a magnetostrictive film and the reservoir element may further include a magnetic field applying unit configured to apply a magnetic field to each of the magnetostrictive films.

(5) In the reservoir element according to the aspect, the magnetic field applying unit may be configured to apply a magnetic field different from magnetic fields of the other magnetostrictive films to at least one of the plurality of magnetostrictive films.

(6) In the reservoir element according to the aspect, each of the plurality of vibrators may have an electrode, and the reservoir element may further include: a counter electrode facing the electrode; and a first alternating current (AC) power supply configured to apply an AC voltage between the electrode and the counter electrode.

(7) In the reservoir element according to the aspect, each of the plurality of vibrators may have an electrode, the reservoir element may further include: a counter electrode facing the electrode; and a direct current (DC) power supply configured to apply a DC voltage between the electrode and the counter electrode, and a potential difference between the electrode of any of the vibrators and the counter electrode is different from potential differences between the electrodes of the other vibrators and the counter electrode.

(8) In the reservoir element according to the aspect, each of the plurality of vibrators may have: a piezoelectric material; and an upper electrode and a lower electrode which sandwich the piezoelectric material therebetween, and the reservoir element may further include a second AC power supply configured to apply an AC voltage between the upper electrode and the lower electrode.

(9) The reservoir element according to the aspect may further include: a strain sensor which is in contact with each of the plurality of vibrators.

(10) A neuromorphic device according to a second aspect includes: the reservoir element according to the aspect.

Advantageous Effects of Invention

The reservoir element and the neuromorphic device according to the aspect have high accuracy for training data of an output signal.

BRIEF DESCRIPTION OF DRAWINGS

FIG. 6 is a plan view of a reservoir element according to a third embodiment.

FIG. 7 is a plan view of a reservoir element according to a fourth embodiment.

DESCRIPTION OF EMBODIMENTS

Embodiments will be described in detail below with reference to the drawings as appropriate. The drawings used in the following description may be shown by enlarging the featured portions for convenience to make the features of the present invention easy to understand in some cases and the dimensional ratios or the like of each constituent element may differ from the actual ratios in some cases. The materials, the dimensions, and the like exemplified in the following description are examples and the present invention is not limited thereto and can be appropriately modified and carried out within the range in which the effects of the present invention are exhibited.

First Embodiment

A neuromorphic device according to a first embodiment is a device obtained by implementing processing in reservoir computing. The reservoir computing is an example of a recurrent neural network.

Figure 1:
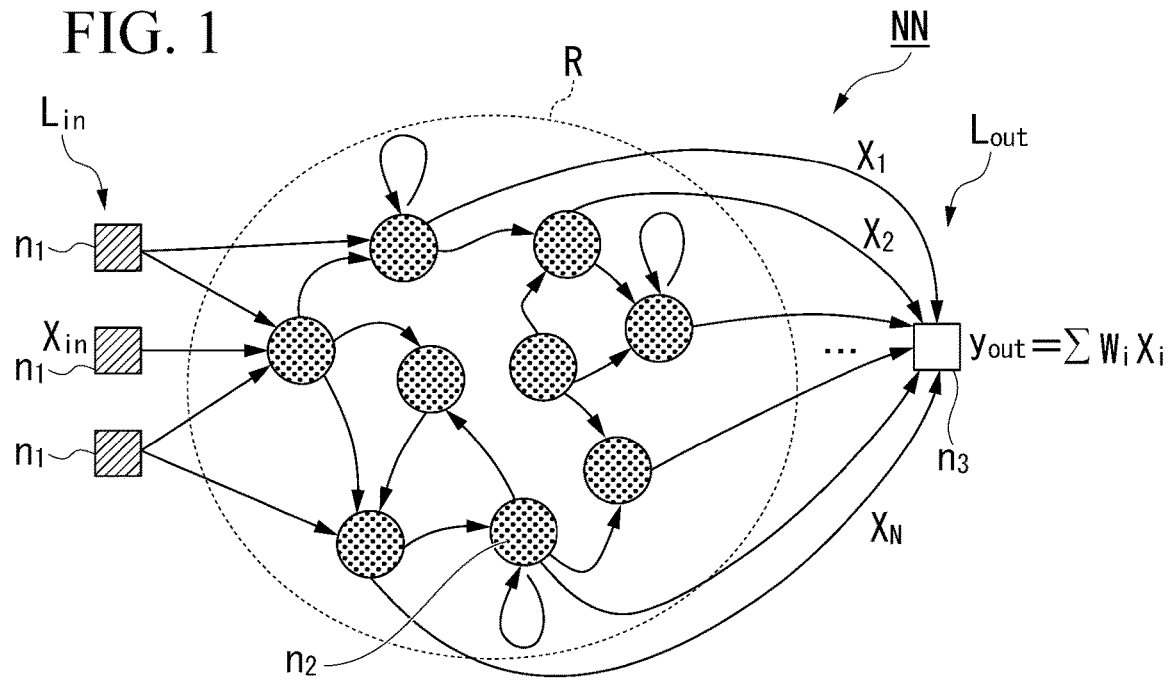
FIG. 1 is a conceptual diagram of a neural network simulated by a neuromorphic device according to a first embodiment.

FIG. 1 is a conceptual diagram of a neural network simulated by the neuromorphic device according to the first embodiment. A neural network NN shown in FIG. 1 is a conceptual schematic diagram of reservoir computing. The neural network NN shown in FIG. 1 has an input layer $L_{in}$, a reservoir R, and an output layer $L_{out}$. The input layer $L_{in}$ and the output layer $L_{out}$ are connected to the reservoir R.

The input layer $L_{in}$ transmits a signal input from the outside to the reservoir R. The input layer $L_{in}$ includes, for example, a plurality of neurons $n_1$. Each of the neurons may also be called a node in some cases. The neuron $n_1$ is an input terminal in the neuromorphic device. An input signal input from the outside to each of the neurons $n_1$ of the input layer $L_{in}$ is transmitted to the reservoir R.

The reservoir R is region in which input signals input from the input layer $L_{in}$ are stored and the input signals interact with each other. In the reservoir R, the signals merely interact and do not learn. If the input signals interact with each other, the input signals change non-linearly. Furthermore, the input signals change with the passage of time by interacting with each other in the reservoir R. In the reservoir R, a plurality of neurons $n_2$ are randomly connected. For example, a signal output from each of the neurons $n_2$ at a certain time t may return to the original neuron $n_2$ at a certain time t+1 in some cases. The neuron $n_2$ can perform processing based on the signals at time t and time t+1 and can process information recursively.

The output layer $L_{out}$ outputs a signal from the reservoir R. The output layer $L_{out}$ includes, for example, a plurality of neurons $n_3$. Each of the neurons $n_3$ is an output terminal in the neuromorphic device. When the signal reaches the output layer $L_{out}$ from the reservoir R, learning is performed. The learning is performed in a transmission path (synapses in the brain) connecting each of the neurons $n_2$ of the reservoir R and each of the neurons $n_3$ of the output layer $L_{out}$. The output layer $L_{out}$ outputs the learning result to the outside.

Figure 2:
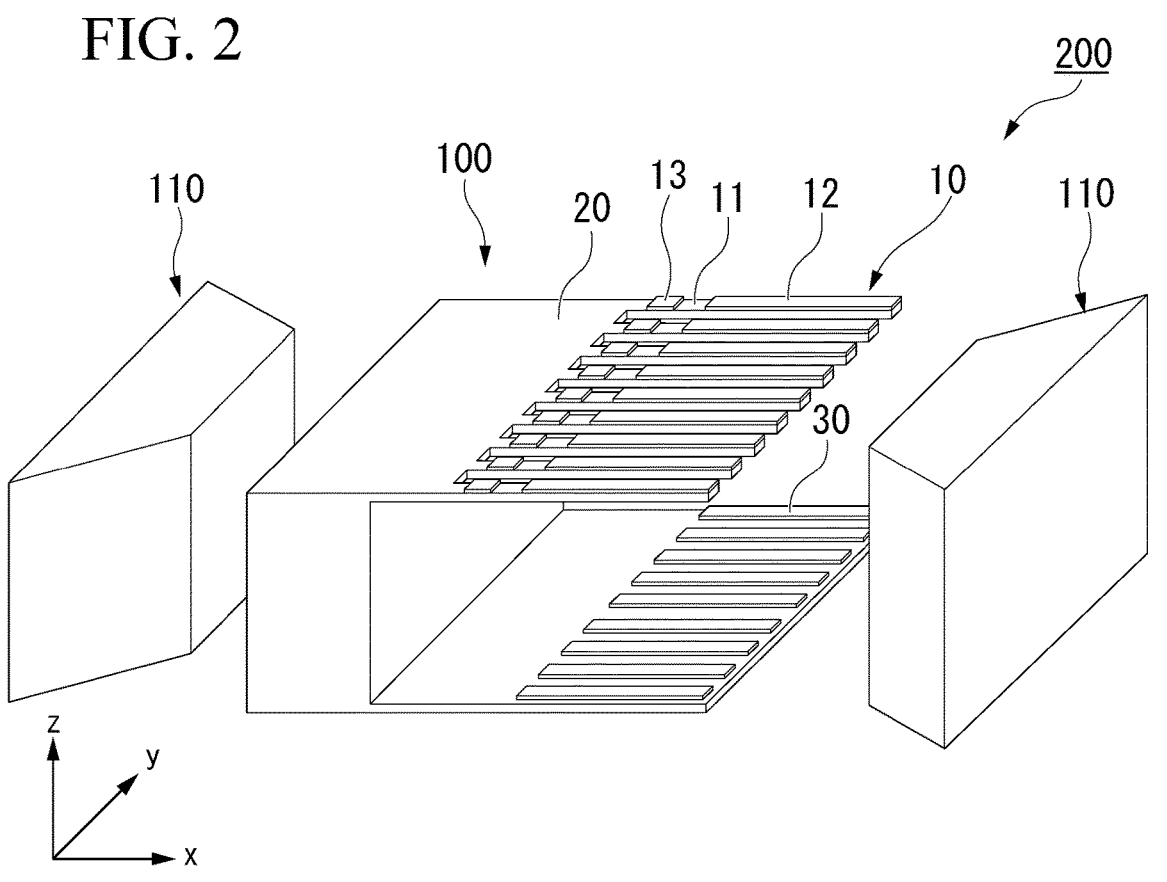
FIG. 2 is a perspective view of a reservoir element according to the first embodiment.
Figure 3:
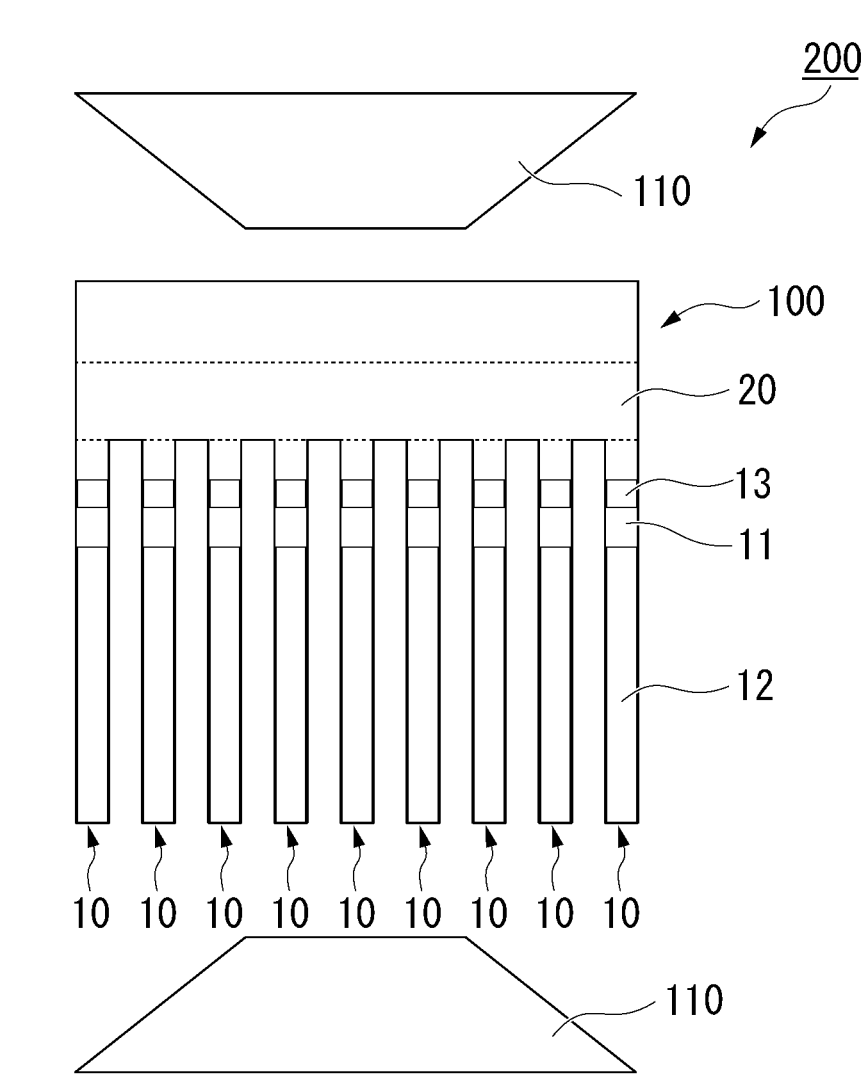
FIG. 3 is a plan view of the reservoir element according to the first embodiment.
Figure 3:
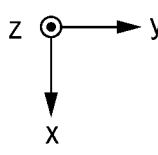
Figure 4:
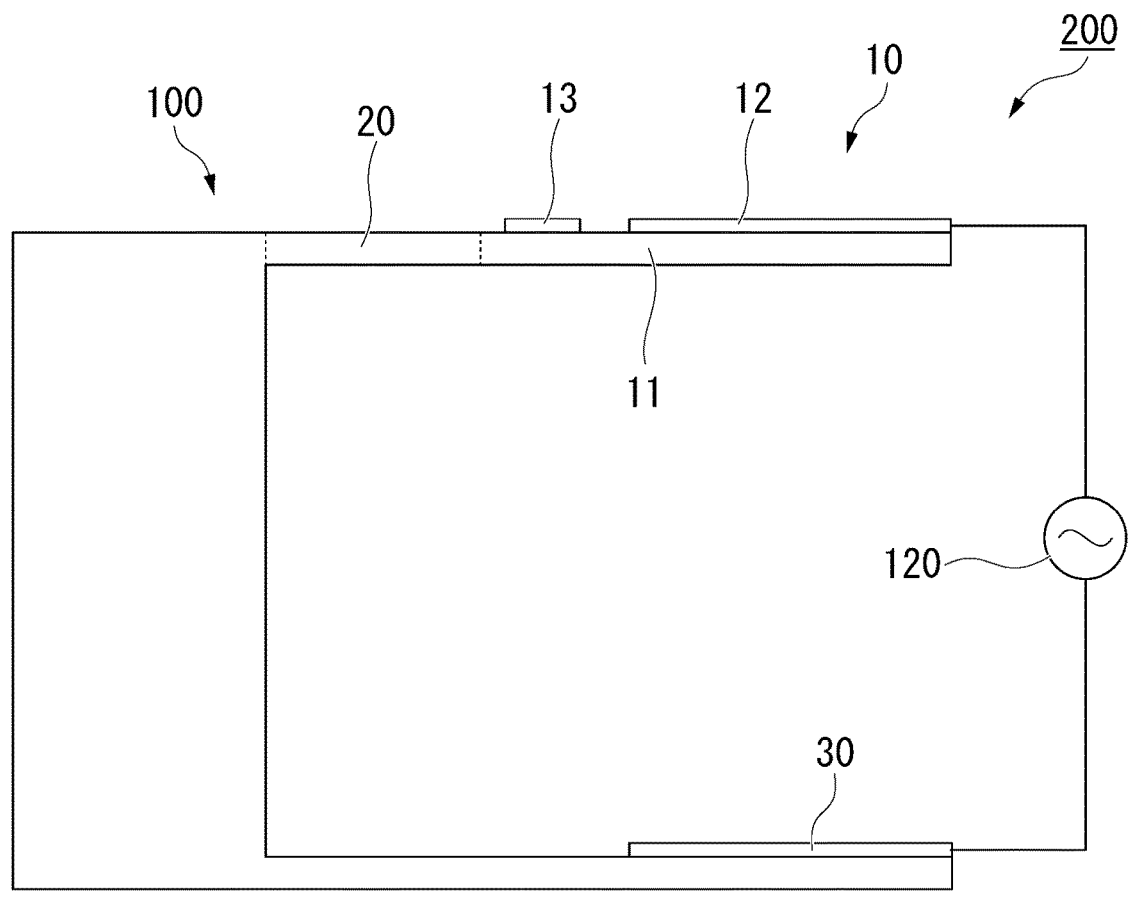
FIG. 4 is a side view of the reservoir element according to the first embodiment.
Figure 4:
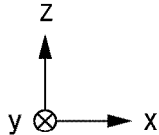

FIG. 2 is a perspective view of a reservoir element 200 according to the first embodiment. FIG. 3 is a plan view of the reservoir element 200 according to the first embodiment. FIG. 4 is a side view of the reservoir element according to the first embodiment. Hereinafter, a direction in which vibrators 10 which will be described later extend is referred to as an "x direction," a direction in which the vibrators 10 are arranged is referred to as a "y direction," and a direction which is orthogonal to the x direction and the y direction is referred to as a "z direction."

The reservoir element 200 includes, for example, a connection vibrator 100, a magnetic field applying unit 110, and an alternating current (AC) power supply 120. In FIGS. 2 and 3, the AC power supply 120 is omitted. In FIG. 4, the magnetic field applying unit 110 is omitted. The reservoir element 200 is a device obtained by implementing the reservoir R.

The connection vibrator 100 has the plurality of vibrators 10, a connection plate 20, and counter electrodes 30. Each of the plurality of vibrators 10 is connected to the connection plate 20. For example, the vibrators 10 each protrude from the connection plate 20 in the x direction and are arranged in the y direction. Each of the counter electrodes 30 is separated from each of the vibrators 10 in the z direction.

Each of the vibrators 10 has a cantilever 11, a magnetostrictive film 12, and a strain sensor 13. At least one of the plurality of vibrators 10 has a vibration state different from that of the other vibrators 10. The vibration state is, for example, an amplitude, a frequency of vibrations, and a phase of vibrations. For example, in at least one of the plurality of vibrators 10, any one or more of the amplitude, the frequency of vibrations, and the phase of vibrations differ. The vibration state of each of the plurality of vibrators 10 follows, for example, a certain distribution. For example, a distribution of the number of vibrators 10 indicating a specific vibration state follows a normal distribution.

The cantilever 11 has a first end connected to the connection plate 20. The cantilever 11 has a second end which vibrates in the z direction with respect to the first end.

The magnetostrictive film 12 is, for example, laminated on one surface of the cantilever 11. The magnetostrictive film 12 is formed of, for example, a NiFe alloy, a FeCo alloy, or a FeCoB alloy. Magnetostriction is a phenomenon in which distortion of a shape occurs due to a change in magnetization of a ferromagnet. The magnetostrictive film 12 also serves as, for example, an electrode.

The magnetostrictive film 12 is distorted if a magnetic field is applied, causing the cantilever 11 to bend. If the cantilever 11 bends, the vibration state of each of the vibrators 10 changes.

The strain sensor 13 is, for example, in contact with one surface of the cantilever 11. The strain sensor 13 detects the vibration of the cantilever 11. The strain sensor 13 is an output unit which outputs a signal. The strain sensor 13 is, for example, a piezoresistive film. The electrical resistance of the piezoresistive film changes when the piezoresistive film is subjected to mechanical strain. The strain sensor 13 may be made of a piezoelectric material. The piezoelectric material is, for example, barium titanate ($BaTiO_3$), lithium niobate ($LiNbO_3$), lithium tantalate ($LiTaO_3$), or lead zirconate titanate (PZT).

The connection plate 20 is connected to each of the plurality of vibrators 10. Widths of the connection plate 20 in the x direction and the y direction are, for example, larger than a thickness thereof in the z direction. The connection plate 20 vibrates if each of the vibrators 10 vibrates. The connection plate 20 propagates the vibration of the vibrators 10 to another vibrator 10. The vibrations of each of the vibrators 10 interfere with each other, for example, at the connection plate 20. The vibrations of the respective vibrator vibrators 10 affect each other.

The counter electrode 30 faces each of the vibrators 10. Each of the counter electrodes 30 faces the magnetostrictive film 12 of each of the vibrators 10. Each of the counter electrodes 30 is electrically connected to the magnetostrictive film 12 of each of the vibrators 10.

The magnetic field applying unit 110 applies a magnetic field to the connection vibrator 100. The magnetic field applying unit 110 applies a static magnetic field to, for example, the magnetostrictive film 12 of each of the vibrators 10. The magnetic field applying unit 110 is, for example, a magnet. The magnetic field applying unit 110 applies a magnetic field different from that of the other magnetostrictive films 12 to, for example, at least one of a plurality of magnetostrictive films 12. The magnetic field applying unit 110 applies a magnetic field having a certain distribution to, for example, a plurality of magnetostrictive films 12. In the embodiment, the magnetic field applying unit 110 is, for example, an example of a means for changing a vibration state of each of the vibrators 10.

The AC power supply 120 is connected to the magnetostrictive film 12 and the counter electrode 30. The AC power supply 120 is an example of the first AC power supply. For example, a plurality of AC power supplies 120 are provided and are connected to the magnetostrictive films 12 and the counter electrodes 30. The AC power supply 120 applies an AC voltage between the magnetostrictive film 12 and the counter electrode 30. In the embodiment, the AC power supply 120 is an example of a means for vibrating the vibrators 10.

An operation of the reservoir element 200 will be described below. The magnetic field applying unit 110 applies a magnetic field to the connection vibrator 100. If a magnetic field is applied, each of the vibrators 10 bends due to magnetostriction. The magnetic field applying unit 110 applies a magnetic field having a certain distribution to, for example, a plurality of magnetostrictive films 12. Since the magnetic field applied to each of the magnetostrictive films 12 by the magnetic field applying unit 110 is not certain, degrees of bending of the vibrators 10 differ.

Subsequently, the AC power supply 120 supplies, for example, an AC voltage between the magnetostrictive film 12 of each of the vibrators 10 and the counter electrode 30. The AC voltage may have a certain amplitude or a time-varying amplitude. For example, an AC voltage with a certain amplitude for driving the vibrators 10 (for example, the frequency of vibrations is about 10 kHz) and a voltage associated with time-series data which changes at regular time intervals (for example, about 0.1 seconds) may overlap. The application of the AC voltage to each of the vibrators 10 by the AC power supply 120 corresponds to the input of a signal from the input layer $L_{in}$ to the reservoir R in the neural network NN.

If an AC voltage is applied between the magnetostrictive film 12 and the counter electrode 30, a periodic electrostatic force is generated between the magnetostrictive film 12 and the counter electrode 30. The electrostatic force causes the vibrators 10 to vibrate. The vibration of the vibrators 10 has a linear component and a non-linear component. As the vibration of the vibrators 10 becomes smaller, the contribution of the linear component becomes greater, but the vibration has a non-linear component.

The vibration states of the vibrators 10 differ depending on the degrees of bending of the vibrators 10. For example, when the vibrator 10 bends, an equilibrium point of the vibrations changes, resulting in asymmetric vibration. A position of the equilibrium point of the vibrations is one of parameters of the reservoir R. Furthermore, if a magnetic field is applied to the magnetostrictive film 12, the Young's modulus of the magnetostrictive film 12 changes. If the Young's modulus of the magnetostrictive film 12 changes, the spring constant and the resonance frequency of the vibration of the vibrator 10 change. At least one of the plurality of vibrators 10 has a vibration state different from that of the other vibrators 10. The vibration state of each of the plurality of vibrators 10 follows, for example, a certain distribution.

Each of the vibrators 10 is connected using the connection plate 20. The vibrations of each of the vibrators 10 affect each other, for example, via the connection plate 20. The interference of the vibration in the connection plate 20 corresponds to the interaction of the signals in the reservoir R. Since the vibration of each of the vibrators 10 has a non-linear component, the non-linear components of the vibration also interact with each other.

The vibration of each of the vibrators 10 is detected by the strain sensor 13. The vibration of each of the vibrators 10 is output to the outside via the strain sensor 13. The output of the strain sensor 13 corresponds to the output of a signal from the reservoir R to the output layer $L_{out}$ in the neural network NN.

In the reservoir element 200 according to the first embodiment, the vibration states of the vibrators 10 are not uniform and the vibrations of the vibrators affect each other. The vibration of the vibrator 10 includes a non-linear component. That is to say, in the reservoir element 200, the non-linear component interacts with the linear component of the vibration of each of the vibrators 10. The reservoir R in the neural network NN stores a plurality of input signals which have been received as inputs and these input signals interact with each other to generate a new signal which is non-linear with respect to the input signals. As described above, each of the vibrators 10 has the vibration including a non-linear component, the vibrations of the vibrators 10 interact with each other, a new non-linear vibration is generated, and the reservoir element 200 realizes the function of the reservoir R in the neural network NN using an actual element.

Also, in the reservoir element 200 according to the first embodiment, the vibration state of each of the vibrators 10 can be freely changed using a magnetic field applied from the magnetic field applying unit 110. That is to say, the reservoir element 200 can easily set a parameter distribution which affects the accuracy of the output signal.

Although the description has been provided above using the reservoir element 200 as an example, the reservoir element 200 can be variously modified and changed. For example, the cantilever 11 may include a magnetostrictive material. In this case, the magnetostrictive film may be omitted. Furthermore, for example, when the plurality of vibrators 10 are sufficiently close to each other, the connection vibrator 100 may not have the connection plate 20. In addition, the AC power supply may be connected over the plurality of magnetostrictive films 12 and the plurality of counter electrodes 30.

Second Embodiment

Figure 5:
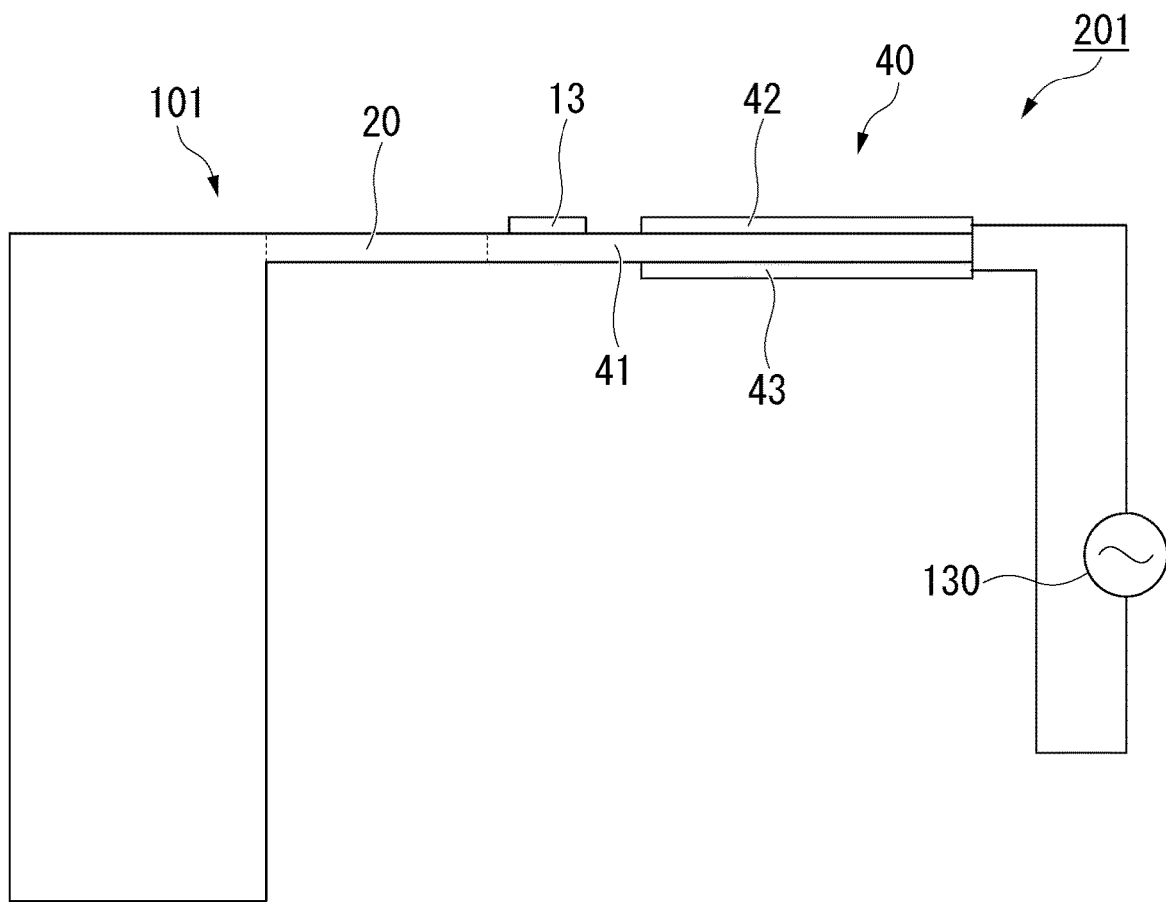
FIG. 5 is a side view of a reservoir element according to a second embodiment.
Figure 5:
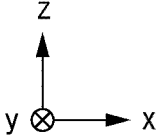

FIG. 5 is a side view of a reservoir element 201 according to a second embodiment. In FIG. 5, a magnetic field applying unit 110 is omitted. A means for vibrating a vibrator 40 of the reservoir element 201 is different from that of the reservoir element 200. The description of the same constitution as that of the reservoir element 200 according to the first embodiment will be omitted below.

A connection vibrator 101 has a connection plate 20 and a plurality of vibrators 40. Each of the vibrators 40 has a cantilever 41, a magnetostrictive film 42, a lower electrode 43, and a strain sensor 13. An AC power supply 130 is connected to the magnetostrictive film 42 and the lower electrode 43. The AC power supply 130 is an example of a second AC power supply. The magnetostrictive film 42 sandwiches the cantilever 41 with the lower electrode 43 and functions as an upper electrode.

The cantilever 41 includes a piezoelectric material. Examples of the piezoelectric material include barium titanate (BaTiO$_3$), lithium niobate (LiNbO$_3$), lithium tantalate (LiTaO$_3$), and lead zirconate titanate (PZT).

The cantilever 41 is disposed between the magnetostrictive film 42 and the lower electrode 43. The AC power supply 130 applies an AC voltage to the cantilever 41. In the embodiment, the AC power supply 130 is an example of a means for vibrating the vibrator 40.

An operation of the reservoir element 201 will be described below. The magnetic field applying unit 110 applies a magnetic field having a certain distribution to, for example, a plurality of magnetostrictive films 42. Since the magnetic field applied to each of the magnetostrictive films 42 by the magnetic field applying unit 110 is not certain, degrees of bending of the vibrators 40 differ.

Subsequently, the AC power supply 130 applies an AC voltage between the magnetostrictive film 42 of each of the vibrators 40 and the lower electrode 43. The application of an AC voltage to each of the vibrators 40 by the AC power supply 130 corresponds to the input of a signal from the input layer L$_{in}$ to the reservoir R in neural network NN.

The cantilever 41 including a piezoelectric material is periodically distorted due to an AC voltage. The periodic distortion generated in the cantilever 41 causes the vibrators 40 to vibrate.

The vibration states of the vibrators 40 differ depending on the degrees of bending of the vibrators 40. At least one of the plurality of vibrators 40 has a vibration state different from that of the other vibrators 40. The vibration state of each of the plurality of vibrators 40 follows, for example, a certain distribution.

In the reservoir element 201 according to the second embodiment, the vibration states of the vibrators 40 are not uniform and the vibrations of the vibrators affect each other. That is to say, the reservoir element 201 realizes the function of the reservoir R in the neural network NN using an actual element. The reservoir element 201 according to the second embodiment has the same effects as the reservoir element 200 according to the first embodiment except for only the difference in which the strain of a piezoelectric material is used as a means for vibrating each of the vibrators 40 in the reservoir element 201 according to the second embodiment.

Third Embodiment

Figure 6:
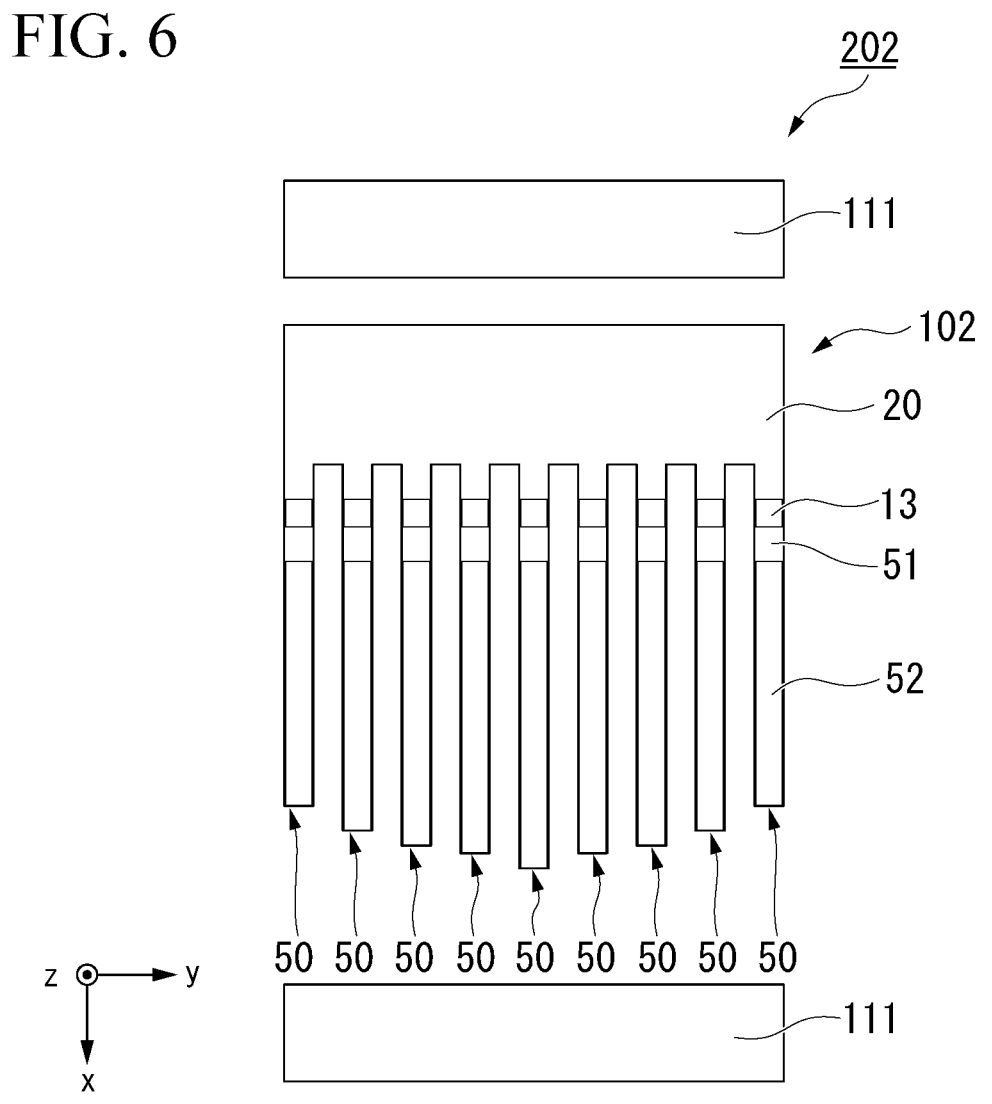

FIG. 6 is a plan view of a reservoir element 202 according to a third embodiment. In FIG. 6, an AC power supply 120 is omitted. A means for changing a vibration state of each vibrator 50 of a reservoir element 202 is different from that of the reservoir element 200. The description of the same constitution as that of the reservoir element 200 according to the first embodiment will be omitted below.

The reservoir element 202 includes a connection vibrator 102, a magnetic field applying unit 111, and an AC power supply 120 (not shown).

The connection vibrator 102 has a connection plate 20, the plurality of vibrators 50, and a counter electrode 30 (not shown). Each of the vibrators 50 has a cantilever 51, a magnetostrictive film 52, and a strain sensor 13. The counter electrode 30 is located at a position in which the counter electrode 30 faces the magnetostrictive film 52 and the AC power supply 120 is connected to the magnetostrictive film 52 and the counter electrode 30.

At least one of the plurality of vibrators 50 has a size different from that of the other vibrators 50. In the plurality of vibrators 50, the sizes of the vibrators 50 have a distribution. For example, the distribution of the sizes of the vibrators 50 follows a normal distribution. Examples of the sizes of the vibrators 50 include a length of the cantilever 51, a thickness of the cantilever 51, a width of the cantilever 51, an area of the magnetostrictive film 52, and a thickness of the magnetostrictive film 52. Although FIG. 6 illustrates a case in which the length of the cantilever 51 is not certain, the present invention is not limited to this case. In the embodiment, a shape of each of the vibrators 50 is an example of a means for changing the vibration state of each of the vibrators 50.

The magnetic field applying unit 111 applies a magnetic field to the connection vibrator 102. The magnetic field applying unit 111 applies a uniform static magnetic field to, for example, the magnetostrictive film 52 of each of the vibrators 50.

An operation of the reservoir element 202 will be described below. The magnetic field applying unit 111 applies a uniform magnetic field to, for example, the plurality of magnetostrictive films 52. Since the shapes of the vibrators 50 differ, the degrees of bending of the vibrators 50 differ.

Subsequently, the AC power supply 120 applies an AC voltage between the magnetostrictive film 52 of each of the vibrators 50 and the counter electrode 30. If the AC voltage is applied between the magnetostrictive film 52 and the counter electrode 30, a periodic electrostatic force is generated between the magnetostrictive film 52 and the counter electrode 30. The electrostatic force causes the vibrators 50 to vibrate.

The vibration states of the vibrators 50 differ depending on the degrees of bending of the vibrators 50. At least one of the plurality of vibrators 50 has a vibration state different from that of the other vibrators 50. The vibration state of each of the plurality of vibrators 50 follows, for example, a certain distribution.

In the reservoir element 202 according to the third embodiment, the vibration states of the vibrators 50 are not uniform and the vibrations of the vibrators affect each other. That is to say, the reservoir element 202 realizes the function of the reservoir R in the neural network NN using an actual element. The reservoir element 202 according to the third embodiment has the same effects as the reservoir element 200 according to the first embodiment except for only the difference in which the vibration state of each of the vibrators 50 is changed in accordance with the shape of the vibrators 50.

Furthermore, although an example in which the vibration state of each of the vibrators 50 is changed in accordance with the shape of the vibrators 50 has been described in the reservoir element 202 according to the third embodiment, the vibration states of the vibrators may be changed by changing the material constituting the vibrators.

Fourth Embodiment

Figure 7:
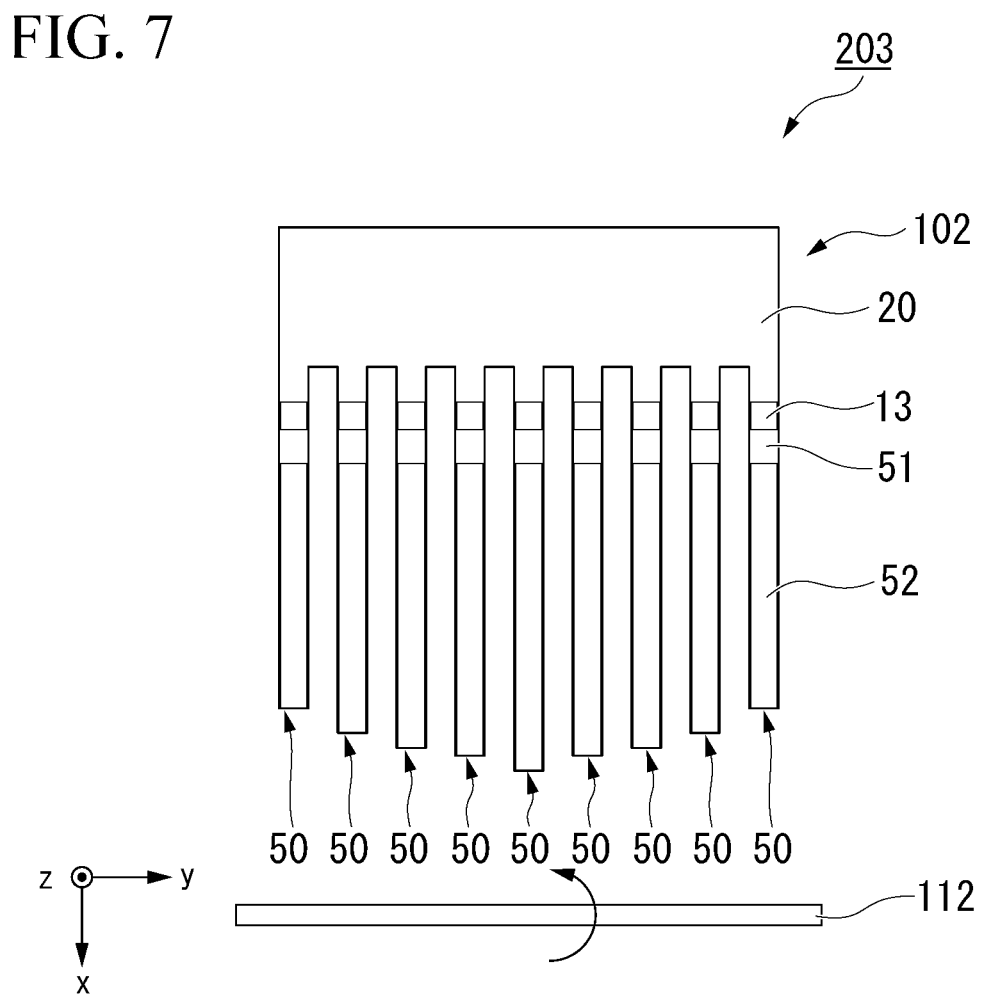

FIG. 7 is a plan view of a reservoir element 203 according to a fourth embodiment. The reservoir element 203 and the reservoir element 202 differ in that a means for vibrating each vibrator 50 is a magnetic field applying unit 112. The description of the same constitution as that of the reservoir element 202 according to the third embodiment will be omitted below.

The reservoir element 203 has a connection vibrator 102 and a magnetic field applying unit 112. The reservoir element 203 does not have an AC power supply 120.

The magnetic field applying unit 112 is a wiring through which a high frequency current flows. The high frequency current generates a high frequency magnetic field around the wiring. The high frequency magnetic field is applied to a magnetostrictive film 52 of each of the vibrators 50.

An operation of the reservoir element 203 will be described below. The magnetic field applying unit 112 applies a high frequency magnetic field to, for example, the plurality of magnetostrictive films 52. The high frequency magnetic field may have a certain amplitude or a time-varying amplitude. For example, a high frequency magnetic field having a certain amplitude for driving the vibrator 50 (for example, the frequency of vibrations of about 10 kHz) and a magnetic field associated with time-series data which changes every fixed time (for example, about 0.1 seconds) may overlap. The high frequency magnetic field periodically distorts the magnetostrictive film 52 of the vibrator 50. The distortion of the magnetostrictive film 52 causes the vibrator 50 to vibrate. Since the vibrators 50 have different shapes, the vibration states of the vibrators 50 differ. The vibration states of the plurality of vibrators 50 follow, for example, a certain distribution.

In the reservoir element 203 according to the fourth embodiment, the vibration states of the vibrators 50 are not uniform and the vibrations of the vibrators 50 affect each other. That is to say, the reservoir element 203 realizes the function of the reservoir R in the neural network NN using an actual element. The reservoir element 203 according to the fourth embodiment has the same effects as the reservoir element 200 according to the first embodiment except for only the difference in which the means for generating the vibration of the vibrator 50 is a high frequency magnetic field and the vibration state of each of the vibrators 50 is changed depending on the shape of the vibrator 50.

Furthermore, also in the reservoir element 203 according to the fourth embodiment, the vibration state of the vibrator may be changed by changing the material constituting the vibrator.

Fifth Embodiment

Figure 8:
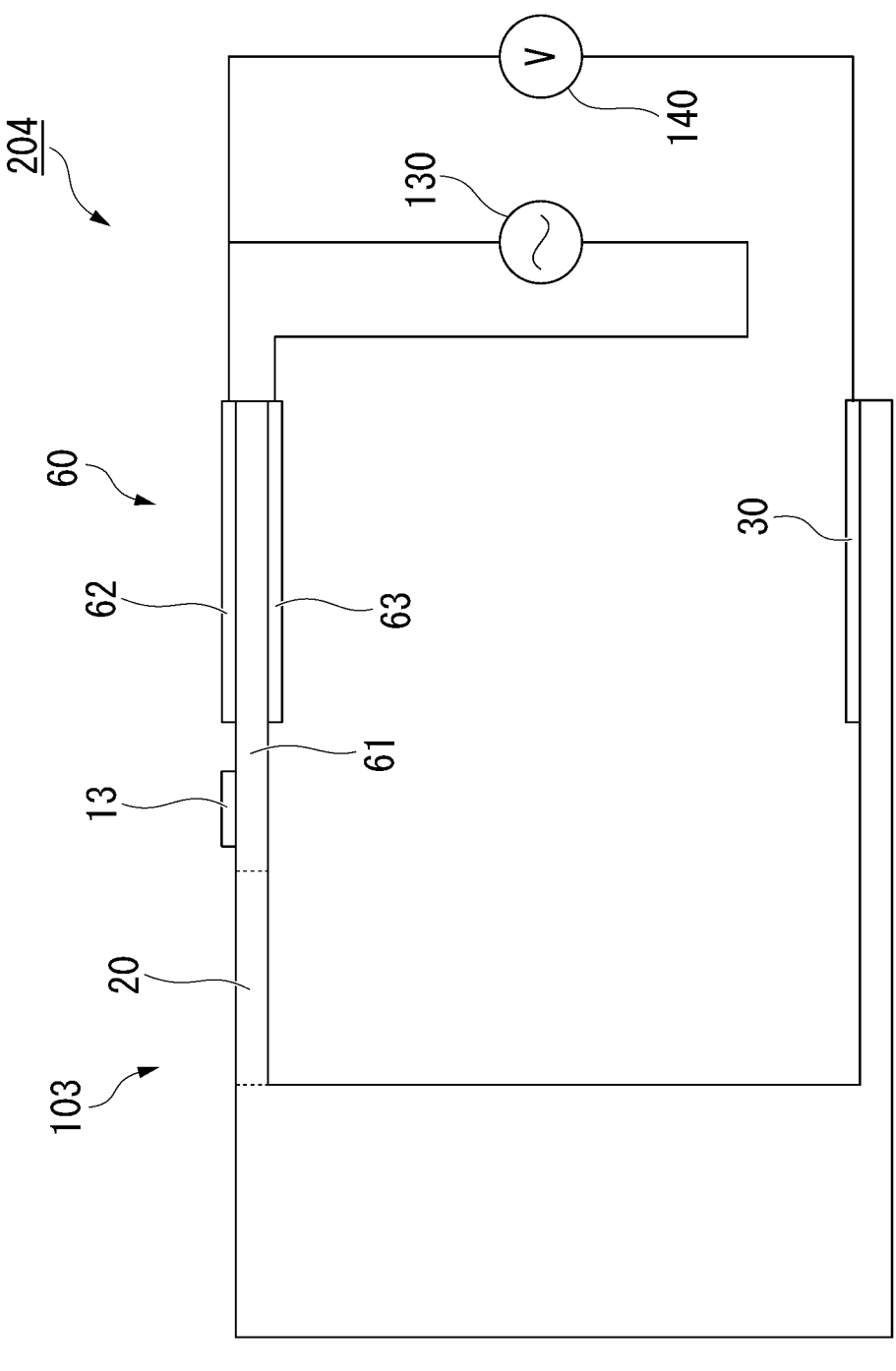
FIG. 8 is a side view of a reservoir element according to a fifth embodiment.

FIG. 8 is a side view of a reservoir element 204 according to a fifth embodiment. The reservoir element 204 and the reservoir element 201 differ in that, in the reservoir element 204, an electrostatic force is used as a means for changing a vibration state of each vibrator 60. The description of the same constitution as that of the reservoir element 201 according to the second embodiment will be omitted below.

The reservoir element 204 has a connection vibrator 103, an AC power supply 130, and a direct current (DC) power supply 140. The reservoir element 204 does not have a magnetic field applying unit 110.

The connection vibrator 103 has a connection plate 20, a plurality of vibrators 60, and a counter electrode 30. The vibrator 60 has a cantilever 61, an upper electrode 62, a lower electrode 63, and a strain sensor 13. The counter electrode 30 is located at a position in which the counter electrode 30 faces the upper electrode 62. The cantilever 61 includes a piezoelectric material. The upper electrode 62 may have conductivity and does not need to be a magneto-strictive film.

The AC power supply 130 is connected to the upper electrode 62 and the lower electrode 63. The AC power supply 130 applies an AC voltage to the cantilever 61 including a piezoelectric material. In the embodiment, the AC power supply 130 is an example of a means for vibrating the vibrator 60.

The DC power supply 140 is connected to, for example, the upper electrode 62 and the counter electrode 30. The DC power supply 140 may be connected to the lower electrode 63 and the counter electrode 30. In the embodiment, for example, the DC power supply 140 is an example of a means for changing the vibration state of each of the vibrators 60.

An operation of the reservoir element 204 will be described below. The DC power supply 140 applies a DC voltage between the upper electrode 62 and the counter electrode 30. If the DC voltage is applied between the upper electrode 62 and the counter electrode 30, the vibrator 60 receives an electrostatic force and bends. Degrees of bending of the vibrator 60 differ depending on a magnitude of the applied DC voltage.

Subsequently, the AC power supply 130 applies an AC voltage between the upper electrode 62 and the lower electrode 63 of each of the vibrators 60.

The cantilever 61 including a piezoelectric material is periodically distorted due to an AC voltage. The periodic distortion generated in the cantilever 61 causes the vibrator 60 to vibrate.

The vibration states of the vibrators 60 differ depending on the degrees of bending of the vibrators 60. At least one of the plurality of vibrators 60 has a vibration state different from that of the other vibrators 60. The vibration state of each of the plurality of vibrators 60 follows, for example, a certain distribution.

In the reservoir element 204 according to the fifth embodiment, the vibration states of the vibrators 60 are not uniform and the vibrations of the vibrators 60 affect each other. That is to say, the reservoir element 204 realizes the function of the reservoir R in the neural network NN using an actual element. The reservoir element 204 according to the fifth embodiment has the same effects as the reservoir element 200 according to the first embodiment except for only the difference in which the means for generating the vibration of the vibrator 60 is the AC voltage applied to the piezoelectric material and the means for changing the vibration state of the vibrator 60 is the DC voltage applied between the upper electrode 62 and the counter electrode 30.

Although the reservoir element has been described in detail above using some embodiments as an example, the constitution of the reservoir element is not limited to these embodiments and various modifications and changes are possible.

For example, the means for vibrating the vibrator and the means for changing the vibration state of the vibrator may be freely combined.

As a means for vibrating the vibrator, for example, there are the following means.
  (i) The vibrator is vibrated due to an electrostatic force by applying an AC voltage between the electrode and the counter electrode.
  (ii) The vibrator is vibrated due to the distortion of the piezoelectric material by applying an AC voltage to the electrodes having the piezoelectric material disposed therebetween.

(iii) The vibrator is vibrated due to the distortion of the magnetostrictive film by applying a periodic magnetic field (for example, a high frequency magnetic field) to the magnetostrictive film.

As a means for changing the vibration state of the vibrator, for example, there are the following means.

(i) A distribution is provided to the magnetic field applied to the magnetostrictive film of each of the vibrators.

(ii) The shapes and the materials of the vibrators differ.

(iii) The magnitude of the electrostatic force applied to the vibrator is changed by changing the magnitude of the DC voltage applied between the electrode and the counter electrode.

Furthermore, the reservoir element according to the above embodiment can be applied to a neuromorphic device. The neuromorphic device has an input unit, a reservoir element, a multiply and accumulate calculation unit, and an output unit.

The input unit is connected to the reservoir element. The input unit corresponds to the input layer $L_{in}$ in the neural network NN. The input unit includes, for example, a plurality of input terminals.

The multiply and accumulate calculation unit is connected to the reservoir element. The multiply and accumulate calculation unit corresponds to a synaptic connection from the reservoir R in the neural network NN to an output layer $L_{out}$. The multiply and accumulate calculation unit performs learning corresponding to the synaptic connection from the reservoir R to the output layer $L_{out}$.

The multiply and accumulate calculation unit includes, for example, a plurality of variable resistors arranged in a matrix form, a plurality of first bit lines connected to each of the variable resistors in the same row, and a plurality of second bit lines connected to each of the variable resistors in the same column. The variable resistors are, for example, magnetic domain wall movement elements. The weight obtained as a result of learning is provided to each of the variable resistors. Resistance values of the variable resistors differ in accordance with the weight provided to each of the variable resistors.

A signal input to the multiply and accumulate calculation unit is transmitted to each of the first bit lines and reaches each of the variable resistors. Each of the variable resistors has a different resistance value in accordance with the provided weight and a multiple calculation is performed by passing a signal through each of the variable resistors. The result of the multiple calculation performed on each of the variable resistors is transmitted to the second bit lines. The result of the multiple calculation of the variable resistors connected to the same second bit lines is aggregated in the same second bits and summed.

The output unit is connected to the multiply and accumulate calculation unit. The output unit corresponds to the output layer $L_{out}$ in the neural network NN. The output unit is composed of, for example, a plurality of output terminals.

Since the neuromorphic device according to the embodiment has the above reservoir element, the reservoir computing is made into a device. Furthermore, parameters are easily set to the reservoir element and the neuromorphic device according to the embodiment has high accuracy for training data.

REFERENCE SIGNS LIST 10, 40, 50, 60 Vibrator
12, 42, 52 Magnetostrictive film
13 Strain sensor
20 Connection plate
30 Counter electrode
43, 63 Lower electrode
62 Upper electrode
100, 101, 102, 103 Connection vibrator
110, 111, 112 Magnetic field applying unit
120, 130 AC power supply
140 DC power supply
200, 201, 202, 203, 204 Reservoir element

What is claimed is:

1. A reservoir element, comprising:
a plurality of vibrators,
wherein at least one of the plurality of vibrators has a vibration state different from vibration states of the other vibrators, and
vibrations of the plurality of vibrators are configured to affect each other
wherein at least one of the plurality of vibrators has a size or a material different from sizes or materials of the other vibrators.

2. The reservoir element according to claim 1, further comprising:
a connection plate,
wherein the connection plate is connected to each of the plurality of vibrators.

3. The reservoir element according to claim 1,
wherein each of the plurality of vibrators has a magnetostrictive film, and
the reservoir element further includes a magnetic field applying unit configured to apply a magnetic field to each of the magnetostrictive films.

4. The reservoir element according to claim 1,
wherein each of the plurality of vibrators has a magnetostrictive film,
the reservoir element further includes a magnetic field applying unit configured to apply a magnetic field to each of the magnetostrictive films, and
the magnetic field applying unit is configured to apply a magnetic field different from magnetic fields of the other magnetostrictive films to at least one of the plurality of magnetostrictive films.

5. The reservoir element according to claim 1,
wherein each of the plurality of vibrators has an electrode, and
the reservoir element further includes:
a counter electrode facing the electrode; and
a first alternating current (AC) power supply configured to apply an AC voltage between the electrode and the counter electrode.

6. The reservoir element according to claim 1,
wherein each of the plurality of vibrators has an electrode,
the reservoir element further includes:
a counter electrode facing the electrode; and
a direct current (DC) power supply configured to apply a DC voltage between the electrode and the counter electrode, and
a potential difference between the electrode of any of the vibrators and the counter electrode is different from potential differences between the electrodes of the other vibrators and the counter electrode.

7. A reservoir element, comprising:
a plurality of vibrators; and
a second AC power supply configured to apply an AC voltage between the upper electrode and the lower electrode, wherein at least one of the plurality of vibrators has a vibration state different from vibration states of the other vibrators, vibrations of the plurality of vibrators are configured to affect each other each of the plurality of vibrators comprises:

a piezoelectric material; and an upper electrode and a lower electrode which sandwich the piezoelectric material therebetween.

8. The reservoir element according to claim 7, further comprising:

a connection plate, wherein the connection plate is connected to each of the plurality of vibrators.

9. The reservoir element according to claim 7, wherein each of the plurality of vibrators has a magnetostrictive film, and the reservoir element further includes a magnetic field applying unit configured to apply a magnetic field to each of the magnetostrictive films.

10. The reservoir element according to claim 7, wherein each of the plurality of vibrators has a magnetostrictive film, the reservoir element further includes a magnetic field applying unit configured to apply a magnetic field to each of the magnetostrictive films, and the magnetic field applying unit is configured to apply a magnetic field different from magnetic fields of the other magnetostrictive films to at least one of the plurality of magnetostrictive films.

11. The reservoir element according to claim 7, wherein each of the plurality of vibrators has an electrode, and the reservoir element further includes:

a counter electrode facing the electrode; and a first alternating current (AC) power supply configured to apply an AC voltage between the electrode and the counter electrode.

12. The reservoir element according to claim 7, wherein each of the plurality of vibrators has an electrode, the reservoir element further includes:

a counter electrode facing the electrode; and a direct current (DC) power supply configured to apply a DC voltage between the electrode and the counter electrode, and a potential difference between the electrode of any of the vibrators and the counter electrode is different from potential differences between the electrodes of the other vibrators and the counter electrode.

13. A reservoir element, comprising:

a plurality of vibrators; and a strain sensor which is in contact with each of the plurality of vibrators, wherein at least one of the plurality of vibrators has a vibration state different from vibration states of the other vibrators, and vibrations of the plurality of vibrators are configured to affect each other.

14. The reservoir element according to claim 13, further comprising:

a connection plate, wherein the connection plate is connected to each of the plurality of vibrators.

15. The reservoir element according to claim 13, wherein each of the plurality of vibrators has a magnetostrictive film, and the reservoir element further includes a magnetic field applying unit configured to apply a magnetic field to each of the magnetostrictive films.

16. The reservoir element according to claim 13, wherein each of the plurality of vibrators has a magnetostrictive film, the reservoir element further includes a magnetic field applying unit configured to apply a magnetic field to each of the magnetostrictive films, and the magnetic field applying unit is configured to apply a magnetic field different from magnetic fields of the other magnetostrictive films to at least one of the plurality of magnetostrictive films.

17. The reservoir element according to claim 13, wherein each of the plurality of vibrators has an electrode, and the reservoir element further includes:

a counter electrode facing the electrode; and a first alternating current (AC) power supply configured to apply an AC voltage between the electrode and the counter electrode.

18. The reservoir element according to claim 13, wherein each of the plurality of vibrators has an electrode, the reservoir element further includes:

a counter electrode facing the electrode; and a direct current (DC) power supply configured to apply a DC voltage between the electrode and the counter electrode, and a potential difference between the electrode of any of the vibrators and the counter electrode is different from potential differences between the electrodes of the other vibrators and the counter electrode.

* * * * *